United States Patent [19]

O'Donnell

[11] Patent Number: 4,657,619

[45] Date of Patent: Apr. 14, 1987

[54] DIVERTER MAGNET ARRANGEMENT FOR PLASMA PROCESSING SYSTEM

[76] Inventor: Kevin P. O'Donnell, 1108 Interlaken Ave., Wanamassa, N.J. 07712

[21] Appl. No.: 802,896

[22] Filed: Nov. 29, 1985

[51] Int. Cl.$^4$ .................... C23C 14/50; C23C 14/36
[52] U.S. Cl. ...................................... 156/345; 156/643; 204/298; 204/192.32; 219/121 PG
[58] Field of Search .................. 156/345, 643, 646; 204/298, 198, 192 E; 219/121 PE, 121 PD, 121 PG

[56] References Cited

U.S. PATENT DOCUMENTS 4,581,118  4/1986  Class et al. ........................ 204/298

FOREIGN PATENT DOCUMENTS 34706  9/1981  European Pat. Off. ..... 219/121 PG

Primary Examiner—Kenneth M. Schor
Attorney, Agent, or Firm—Kenyon & Kenyon

[57] ABSTRACT

A flat book-shaped substrate support electrode for a magnetically enhanced plasma processing apparatus has primary magnetic poles at first and second ends for generating a primary magnetic field that extends between the ends of the electrode in front of a processing surface of the electrode. An auxiliary magnet structure is spaced from the processing surface for generating an auxiliary magnetic field that tends to flatten the primary magnetic field. A diverter magnet generates a third magnetic field having curved lines of force centered on an axis spaced from a first edge of the electrode toward which electron drift occurs. The third magnetic field interacts with the resultant of the primary field and the auxiliary field at the first edge of the electrode and acts to stabilize the plasma in this region.

5 Claims, 5 Drawing Figures

DIVERTER MAGNET ARRANGEMENT FOR PLASMA PROCESSING SYSTEM

TECHNICAL FIELD

The present invention relates to magnetically enhanced plasma processing of workpieces such as silicon wafers. In particular, the invention relates to apparatus and a method for modifying the magnetic field of a magnetically enhanced electrode for supporting a workpiece in a plasma processing system.

BACKGROUND ART

Increasing miniaturization of electronic circuitry has required improved techniques in thin film technology involving the deposition and removal of molecular layers of materials onto and from a workpiece such as a silicon wafer, which conventionally serves as a substrate for Very Large Scale Integrated (VLSI) circuits. One well known plasma processing technique for removing thin layers of material is reactive ion etching or plasma etching. In this process, an electrical gas discharge, or plasma, is created by imposing a direct current (dc) voltage or, preferably, a radio frequency (rf) voltage between electrodes in a space occupied by a normally non-reactive gas at low pressure. Energetic electrons emitted from the negative electrode collide with neutral gas atoms or molecules to create ions or other reactive species and additional electrons, thereby initiating and maintaining a highly conductive glow discharge in a region adjacent to the electrode. This glow discharge or plasma is separated from the electrode surface by a dark space or plasma sheath.

Since the plasma is essentially equipotential, the voltage drop between the plasma and the electrode occurs in the plasma sheath, and the direction of the electric field is normal to the electrode surface. Consequently, the ions and other reactive species generated in the plasma, which typically carry a positive charge, are attracted to the surface of an oppositely charged electrode surface and travel from the plasma to the surface primarily in a direction parallel to the electric field lines. In the plasma etching process, the above-mentioned electrode serves as a substrate support, so when the ions or reactive species reach the surface of the substrate they either activate or take part in a chemical reaction resulting in the desired removal of material from the substrate surface.

U.S. Pat. No. 4,422,896 of W. H. Class et al. discloses the use of magnetic enhancement for plasma etching process. In one proposed arrangement, an electrode is formed with a prismatic body having several flat faces, constituting substrate support surfaces, arranged symmetrically about an axis. First and second magnetic pole pieces of opposite polarity project outwardly from the faces and extend completely around the electrode body at respective ends of the body, the resulting structure being basically spool-shaped. A magnetic field extending between the pole pieces thus forms a continuous belt around the body of the electrode adjacent to the substrate support surfaces.

The symmetrical prismatic spool shape of this previously proposed electrode provides multiple substrate support surfaces and is particularly suited to be mounted for rotation about its axis so that, in bias sputtering applications, each face can be directed in succession toward one or more sputtering targets. The prismatic shape also permits loading or processing a large number of substrates for a given size of electrode.

The symmetrical prismatic electrode must be centrally positioned in a vacuum chamber, however, and requires substrate holding devices because no more than one of the substrate support surfaces can be horizontal facing upwards. Many commercial sputtering systems, and particularly those used for integrated circuit production on ceramic wafers, are arranged to process the wafer substrates lying flat. A symmetrical prismatic electrode is not adapted for installation in such equipment.

In addition, the plasma region produced by such prismatic spool-shaped electrodes tends to be nonuniform, since the belt-like magnetic field bulges outward at its center region. This causes the plasma thickness to be greater at the center region than at the ends of the electrode body, thereby resulting in a non-uniform processing of the substrate surfaces.

A pending U.S. patent application, Ser. No. 06/461,022 now U.S. Pat. No. 4,581,118, owned by the assignee of the present application, proposes a magnetically enhanced substrate support electrode that is adapted for use in a chamber where the substrate lies flat and is intended to produce uniform plasma processing of an exposed surface of a substrate supported by the electrode. The electrode includes a rectangularly parallelepipedal body, the thickness of which is substantially less than its width and length, and two magnetic members constituting a first magnetic pole of one polarity disposed at one end of the body and a second magnetic pole of opposite polarity at the other end of the body.

One face of the electrode body is a substrate support surface, and each magnetic pole member projects beyond this face for the full width of the electrode body, so that a magnetic field extends longitudinally between the first and second poles for the full width of the electrode body adjacent to the substrate support surface. Preferably, the magnetic pole members project from both faces and from the side edges of the body to form a continuous peripheral flange at each end such that the magnetic field between the first pole and second pole surrounds the electrode body like a belt.

To improve uniformity of processing of the exposed surface of a substrate placed on the electrode, an auxiliary magnet means can be positioned in spaced relation to and facing the electrode support surface, the auxiliary magnet means having a third pole member positioned adjacent to the first pole member of the electrode and having the same polarity. A fourth pole member of the auxiliary magnet is positioned adjacent to the second pole member of the electrode. The strength and location of the auxiliary magnet are such that the resultant field adjacent to the substrate support surface is flattened and extends substantially parallel to the support surface.

The flattened field obtained by using the auxiliary magnet arrangement described above improves the uniformity of etching, for example, over most of the surface of a silicon wafer, but it has been found that there still remains a region, known as a "hot spot", where etching occurs at a significantly greater rate than over the rest of the substrate.

The "hot spot" region is located at the so-called leading edge of the support electrode, the leading edge being defined in relation to the direction of electron drift. In a magnetically enhanced plasma system in which the magnetic and electric fields cross each other substantially at right angles, electron drift takes place in an epicycloidal path that extends generally in a direction mutually orthogonal to the magnetic and electric fields. For a rectangular workpiece support electrode of the type described above, the electric field is perpendicular to the substrate support surface, and the magnetic field extends parallel to the support surface in the lengthwise direction of the electrode. Consequently, electrons drift generally from a first side edge to the opposite side edge of the electrode. The first side edge is the leading edge. Because of the magnetic and geometric structure of the electrode and the auxiliary magnet, there is some increased concentration of reactive ions in this leading edge "hot spot" region.

SUMMARY OF THE INVENTION

A principal object of the present invention is to modify the magnetic field in the "hot spot" region of a magnetically enhanced workpiece support electrode in a plasma processing system equipped with an auxiliary field shaping magnet so as to improve the uniformity of processing over the entire exposed surface of a workpiece.

Another object of the invention is to modify the magnetic field of a magnetically enhanced workpiece support electrode by use of magnet means placed outside the vacuum chamber to avoid interference with equipment inside the chamber.

A still further object of the invention is to modify the magnetic field of a magnetically enhanced workpiece support electrode so as to obtain uniform plasma processing over the maximum possible area of the electrode, thereby maximizing the workpiece size that can be handled by a given plasma processing apparatus.

Yet a further object of the invention is to provide a diverter magnet arrangement that is inexpensive and simple to manufacture for modifying the magnetic field of a magnetically enhanced workpiece support electrode These and other objects are achieved by a magnetically enhanced plasma processing apparatus, the apparatus including a vacuum chamber, a workpiece support electrode having a length dimension extending between first and second ends of the electrode, a width dimension between first and second side edges of the electrode, a thickness dimension smaller than the length and width dimensions, and a processing surface for supporting a flat workpiece between the first and second ends and the first and second side edges of the electrode;

primary magnet means including first and second magnetic members disposed at the first and second ends, respectively, of the electrode, the first magnetic member constituting a first magnetic pole of one polarity and the second magnetic member constituting a second magnetic pole of polarity opposite to that of the first magnetic pole, the first and second magnetic poles generating a primary magnetic field that extends between the poles in the direction of the length dimension of the electrode in front of the processing surface;

auxiliary magnet means spaced from the processing surface and having third and fourth magnetic poles disposed opposite the first and second magnetic poles, respectively, of the primary magnet means for generating an auxiliary magnetic field that tends to flatten the primary magnetic field in front of the processing surface;

means for evacuating the vacuum chamber;

means for delivering at least one preselected gas to the chamber; and means for delivering electrical energy to the electrode sufficient to generate a plasma of ionized particles of said gas within the magnetic field in front of the processing surface, the polarity of the magnetic members being predetermined such that electron drift within said plasma occurs generally in the direction from the first edge of the electrode toward the second edge thereof, wherein the improvement comprises:

diverter magnet means for generating a diverter magnetic field having curved lines of force centered on an axis spaced from and parallel to the first edge of the electrode.

The above and other objects and features of the invention, as well as its advantages over the prior art will be more apparent from the following detailed description in connection with the accompanying drawings.

BEST MODE FOR CARRYING OUT THE INVENTION

Figure 1:
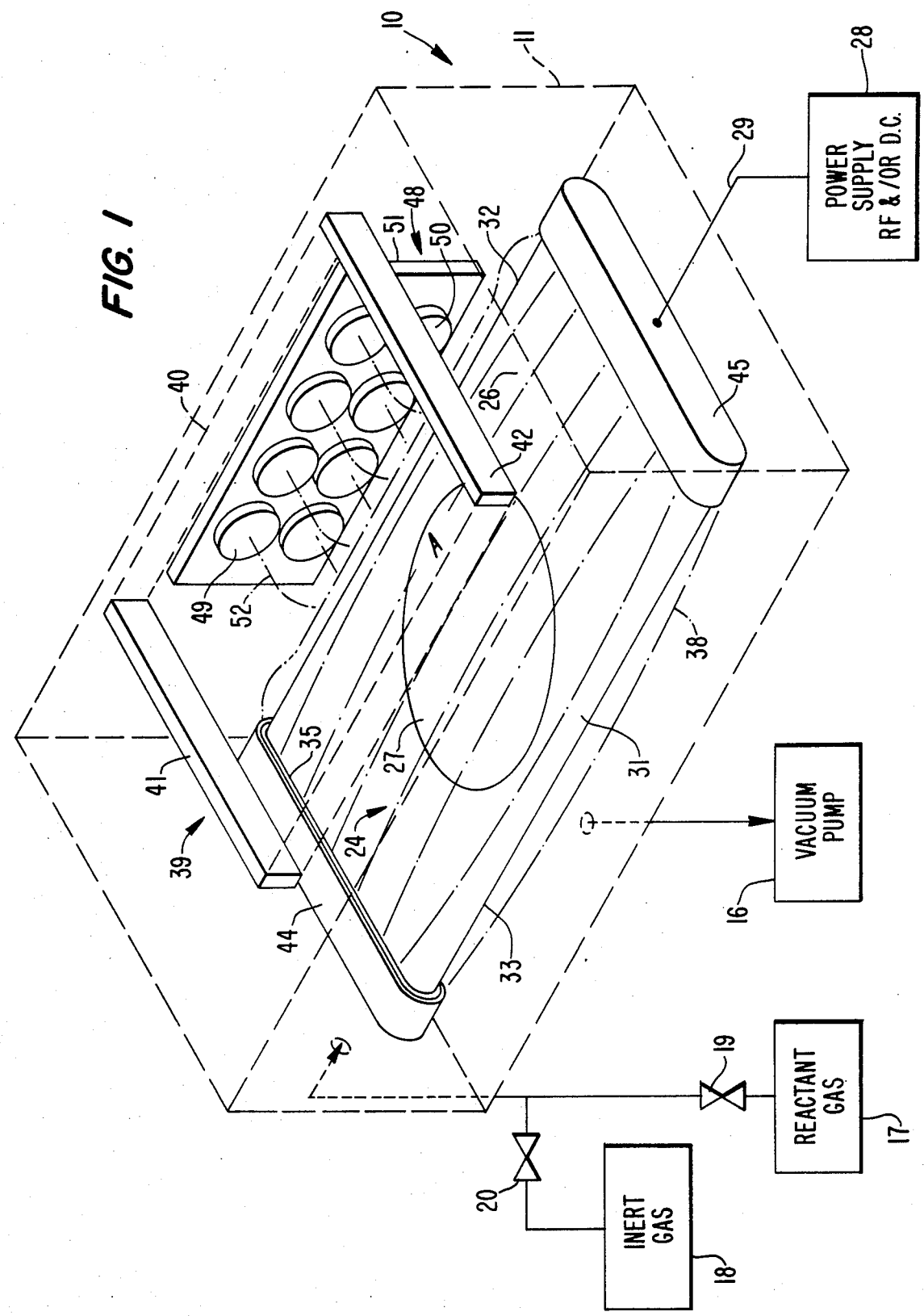
FIG. 1 is a simplified semi-schematic perspective view of a plasma processing apparatus including a diverter magnet arrangement according to the present invention.
Figure 2:
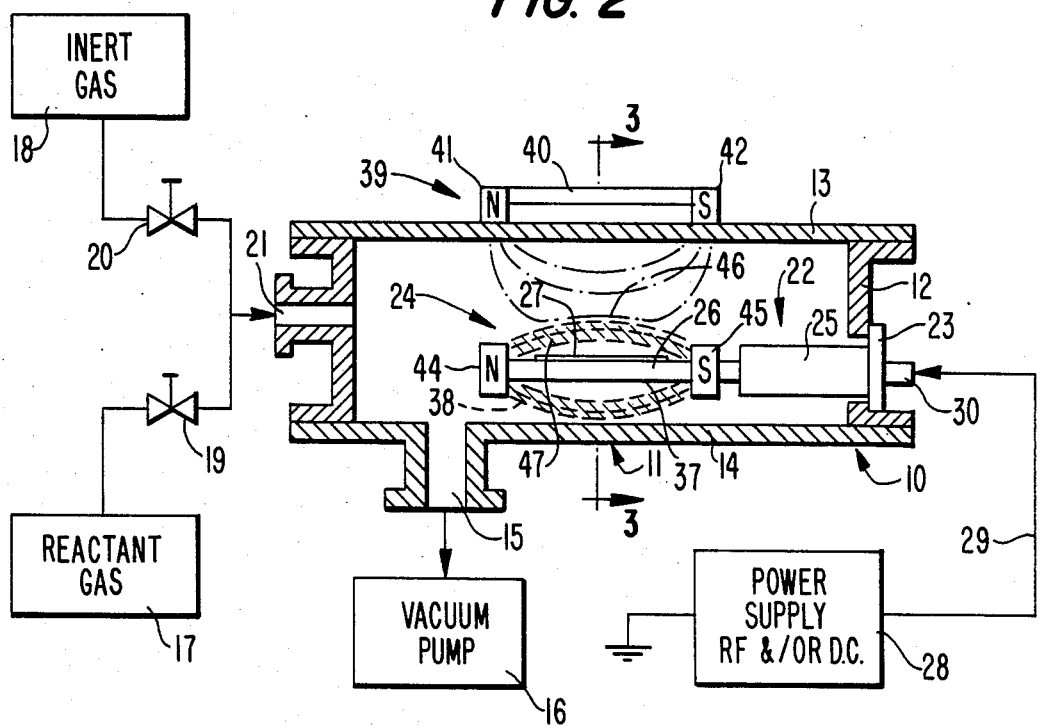
FIG. 2 is a front elevation view, partly in section, of the apparatus shown in FIG. 1.
Figure 3:
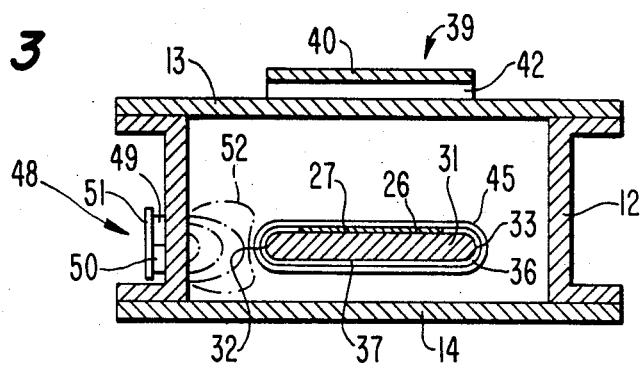
FIG. 3 is a side elevation view in cross section of the apparatus taken along the line 3—3 of FIG. 2 and showing the magnet means to the workpiece support electrode.

With reference to FIGS. 1-3, a plasma processing apparatus 10 includes a hermetic chamber 11 having an open-ended shell 12 closed by a top sealing plate 13 and a bottom sealing plate 14. FIG. 1 shows this chamber 11 purely schematically in dashed lines as a rectangular box so as to interfere as little as possible with the view of the elements draw in solid lines, and which will be described in detail below. In addition, none of the figures shows conventional clamping means, such as bolts and nuts, and conventional seals, such as O-rings, which are needed to provide the necessary vacuum-tightness of the chamber assembly.

A pump-out opening 15 in the bottom plate leads to a vacuum pump 16. At least one reactant gas, such as oxygen, may be introduced into the chamber, either alone or with an inert gas, such as argon, from respective sources 17 and 18 through respective valves 19 and 20 and inlet 21.

A magnetically enhanced workpiece (or substrate) support electrode assembly 22 extends into the chamber and is sealingly attached to the shell 12 by a mounting plate 23 (not shown in FIG. 1) and suitable fasteners and seals (not shown).

The substrate support electrode assembly 22 includes an electrode 24 of reactangular cross section carried by a tubular support 25 (not shown in FIG. 1) which is welded or otherwise attached to mounting plate 23.

The upper face 26 of the electrode serves as a support surface for a workpiece substrate 27, such as a conventional ceramic disc or semiconductor wafer used in the manufacture of integrated circuits. Electric power is supplied from a power supply 28 via line 29 to a coupling 30 (not shown in FIG. 1) mounted on the outer end of the electrode assembly 22. The power supply can be of any commercially available type used in conventional plasma processing systems. Preferably, the power is supplied at the standard radio frequency reserved for such equipment, either with or without a dc bias voltage. Coupling 30 also may be equipped with inlet and outlet connections (not shown) for permitting a flow of cooling fluid to the interior of the substrate support electrode.

The substrate support electrode 24 is an assembly comprising an electrode body 31 of electrically conductive nonmagnetic material, such as copper or aluminum. Body 31 is generally in the form of a rectangular parallelepiped having a thickness dimensions that is substantially less than its length or width dimensions. In other words, it is "book-shaped", preferably with rounded side edges 32 and 33.

Disposed within body 31 is at least one bar magnet (not shown) extending longitudinally between a first magnetic member 35 constituting a first magnetic pole and a second magnetic member 36 constituting a second magnetic pole. The magnetic members are composed of magnetically permeable material such as soft iron. Each magnetic member is disposed at a respective end of the electrode body and projects outwardly from at least the support face 26 of the electrode body for the full width of the body. Preferably, the magnetic members 35 and 36 also project from the obverse face 37 and the side edges 32 and 33 to form continuous peripheral flanges at each end of the electrode body. As a result, a primary magnetic field, indicated by broken lines 38, extends longitudinally across the air gap between the first and second magnetic poles and completely surrounds the electrode body like a belt or curtain. Thus, the primary magnetic field in combination with the electrode structure forms an enclosed electron trap adjacent to the exposed surfaces of the electrode body. The strength of this magnetic field typically may be on the order of 100 Maxwell/cm$^2$ (100 Gauss), but it may range from approximately 50 to approximately 1000 Maxwell/cm$^2$.

An auxiliary magnet means 39 is mounted on the cover 13 of the vacuum chamber. This auxiliary magnet means includes at least one elongated bar magnet 40 provided with a third magnetic pole member 41 and a fourth magnetic pole member 42. The third and fourth pole members are disposed so that like poles are aligned with like poles of the respective first and second magnetic pole members of the primary magnet means. That is, pole member 41, which is a north (N) pole in the figures, is aligned with north pole member 35. Similarly, S pole member 42 is aligned with S pole member 36. The purpose of the auxiliary magnet means, as explained in more detail below, is to produce a second magnetic field that opposes and tends to flatten the primary magnetic field over the processing surface. This flattening effect is created by the interaction between the field lines 43 of the auxiliary magnet and the field lines 38 of the primary magnet.

When rf power is applied to the electrode, a dense glow discharge, or plasma, is created in the electron trap formed by the belt-like magnetic field. To prevent this discharge from the adjacent surfaces of the electrode assembly, it is customary to attach cup-shaped dark space shields 44, 45 by means of insulators (not shown) to cover the magnetic pole members 35, 36, as is well known in the art.

The plasma processing equipment illustrated in FIGS. 1-3 is particularly suitable for performing plasma etching, also known as magnetic ion etching in the case of equipment having a magnetically enhanced substrate support electrode.

The general procedure for magnetic ion etching is as follows:

After a substrate 27 has been placed on the support surface 26 of electrode 24, the vacuum pump 16 is turned on to evacuate the chamber 11. When a desired vacuum level has been maintained for long enough to sufficiently outgas the components in the chamber, a reactant gas, or a mixture of inert gas and reactant gas, is introduced into the chamber through valves 19 and 20 until the desired operating pressure is reached; this is typically in the range of 0.01 to 7 N/m$^2$ (0.1 to 50 millitorr). Rf power is then applied to the substrate support electrode, resulting in the formation of a dense gas discharge or plasma localized in the region of the magnetic belt which extends around the periphery of the electrode and is shown in FIG. 1 and FIG. 2 by the dashed magnetic lines 38. The glow discharge itself occurs within the region 46 contained within the diagonal lines (shown only in FIG. 2). A similar confined discharge forms if a negative dc potential is applied to the electrode.

The ions and reactive radicals generated within the plasma move under the influence of the electric field toward the exposed surface of the workpiece or substrate 27. If the ions are chemically inert, they tend to sputter or physically erode particles from the substrate surface. The voltage gradients in such a magnetically enhanced electrode arrangement are small enough, however, that sputtering is minimal, particularly if most of the gas present in the chamber is a reactant gas. The reactive radicals are chosen to react chemically with the surface material of the substrate to form a gaseous compound, so that the surface material is primarily etched away. The magnetic pole pieces 35 and 36 are also exposed to the plasma in the regions near the magnetic gap. For this reason, they should be covered by pole piece lids (not shown) made of a material which is inert to the reactive species present in the plasma to prevent etching of the pole pieces and contamination of the substrate.

The plasma region 46 extends towards, but does not reach and touch, those surfaces which are maintained at electrode potential. The space 47 where no plasma exists is known as the plasma sheath region. It is well known that when an electrode is capacitively coupled to an rf power supply, the rectification properties of the plasma cause a dc bias to develop between the electrode surface and the plasma (see for example Chapter 5 of "Gas Discharge Process" by B. N. Chapman). The bias is such that the plasma is positive with respect to the electrode, except for a very short time period during each rf cycle). This dc bias creates an electric field in the plasma sheath region which is everywhere perpendicular to the electrode surface. The plasma itself is substantially free of electric fields.

The mechanism of ion formation in the plasma (and reactive radical formation when a reactant gas is used) starts with the emission of electrons from the negatively biased electrode surface. These so-called primary electrons are accelerated towards the plasma by the electric field in the plasma sheath 47, gaining sufficient energy to cause ionization and reactive species formation upon collision with neutral gas atoms. In the absence of the magnetic field, a large fraction of the primary electrons continues to move away from the electrode surface, thereby extending the glow discharge to regions which are far removed from the electrode surface. In addition, many do not collide with a gas atom before they reach an anode surface, so that the degree of ionization and reactive species generation is limited.

The enclosed magnetic field shown in FIGS. 1 and 2 alters the electron trajectories, dramatically improving this situation. Consider, for example, those electrons which are emitted from the electrode face 26 and from the exposed surface of the substrate 27. Here the sheath electric field is perpendicular to the magnetic field. As a result, the E×B electron drift motion is directed out of the plane of FIG. 1, causing the electrons to circulate around the periphery of the prismatic electrode, remaining at all times in the magnetic belt, very close to substrate 27, whereby ionization or reactive species generation induced by these electrons is confined to a plasma region close to the electrode surface.

The electrons emitted from the projecting pole piece surfaces are confined in a different way. Here, the sheath electric field lines are parallel to the magnetic field lines, so the electrons, after acceleration into the plasma region, continue to move in a spiralling manner parallel to the magnetic field lines. This motion carries the electrons to the opposite surface. However, upon approaching the opposite sheath field, the electrons are repelled back into the plasma and are consequently also trapped, oscillating to and fro close to the substrate surface.

Thus, all the electrons are trapped by the combined action of the closed loop E×B drift and the oscillating to and fro motion. Electrons can escape from this trap only slowly when collisions with gas atoms cause them to cross magnetic field lines until they finally move to the dark space shields 44 and 45, whereupon they are removed from the discharge.

The radial spacing between the electrode substrate support face 26 and the plane defined by shields 44 and 45 largely determines the thickness of the plasma belt 46. Although this belt is maintained closely adjacent to the exposed substrate surface, it can be seen that the magnetic field lines curve or bulge convexly outward in the central region between the poles. Since the inner and outer envelopes of the glow discharge region conform generally to the magnetic field lines, it is clearly apparent from FIG. 2 that both the plasma and the sheath field are substantially thicker in the mid region than near the poles.

The previously mentioned pending U.S. patent application Ser. No. 06/461,022 is directed toward solving a problem of nonuniform etching caused by the thicker plasma sheath field in the mid region of the magnetic envelope. The auxiliary magnet arrangement disclosed therein significantly improves nonuniformity resulting from the above described bulge in the field lines except for a "hot spot" shown as a region A on the substrate surface adjacent to the edge 32, which in the illustrated arrangement is the leading edge of the support electrode because the polarity of the magnetic members is selected to be north (N) for member 35 and south (S) for member 36.

Although the causes of the "hot spot" in this region are not fully understood, it is believed that fringing of the resultant magnetic field at the edge of the electrode produced by interaction of the primary and auxiliary magnets may be a significant factor. The solution proposed by the present invention is to provide a magnetic diverter field that interacts with the resultant of the primary field and the auxiliary field at the leading edge of the electrode and acts to stabilize the plasma in this region.

Figure 4:
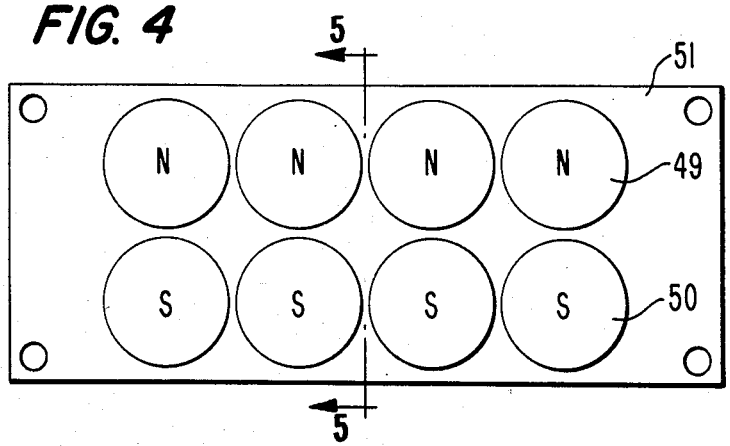
FIG. 4 is a plan view of a preferred embodiment of a diverter magnet assembly according to the invention.
Figure 5:
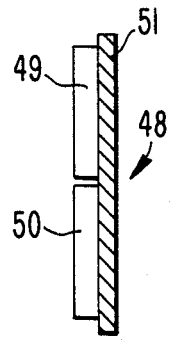
FIG. 5 is a cross-sectional view of the diverter magnet assembly taken along the line 5—5 in FIG. 4.

As shown particularly in FIGS. 1 and 3, a diverter magnet assembly 48 is disposed adjacent to the leading edge 32 of the substrate support electrode. The diverter magnet assembly, which is shown in enlarged detail in FIGS. 4 and 5, includes two parallel rows of disc magnets 49 and 50 arranged on a rectangular plate 51 of steel or other magnetic material. The disc magnets should be made of a material capable of producing a magnetic field strength at the leading edge of the substrate support electrodes that is roughly equal to the strength of the primary field created by the magnetic members 35 and 36 in that region. A suitable material is sold commercially under the name "HICOREX 96A."

The disc magnets 49 are arranged with their exposed faces being all of one magnetic polarity (N in the drawings), and the disc magnets 50 are arranged with their exposed faces being all of the opposite magnetic polarity (S in the drawings). The steel plate 51, to which the disc magnets are adhered by magnetic attraction, serves both to complete the magnetic circuit and as a mounting plate for the assembly.

With reference to FIGS. 1 and 3, the diverter magnet assembly is disposed with the plate 51 perpendicular to the plane of the electrode support surface and parallel to the leading edge 32. The row of disc magnets 49 form an elongated fifth magnetic pole that is disposed horizontally above the plane of the electrode support surface, and the row of disc magnets 50 form an elongated sixth magnetic pole that is disposed horizontally below the plane of the electrode support surface.

Desirably, the diverter magnet assembly can be mounted on the outside wall of the vacuum chamber, as shown in FIG. 3, assuming that the chamber is made of nonmagnetic material such as aluminum or stainless steel. The diverter magnet assembly can be housed in a nonmagnetic metal or plastic casing (not shown), if desired for reasons of cleanliness and appearance.

When the diverter magnet assembly is disposed in relation to the substrate support electrode as described above, its magnetic field extends in curved paths (illustrated by dashed lines 47) from the fifth pole to the sixth pole. This diverter magnetic field deflects the primary magnetic field lines 38, as shown in FIGS. 1 and 3, to create a stabilizing magnetic field region adjacent to the leading edge of the electrode.

To demonstrate the effectiveness of the above diverter magnet arrangement in improving magnetic ion etching of a standard 4-inch diameter silicon wafer, a magnet assembly was manufactured having the following specifications:

A. Disc magnets 44, 45
   Material—HICOREX 96A
   Diameter 2.54 cm (1 inch)
   Thickness—0.95 cm (⅜ inch)
   Mag. field strength at face—3,000 Maxwell/cm$^2$ (3,000 Gauss)

B. Backing plate 46
   Material—steel
   Length—11.75 cm (4⅝ in)
   Width—5.08 cm (2 in)
   Thickness—0.32 cm (⅛ in)

The diverter magnet assembly was mounted on the outside of a nonmagnetic stainless steel vacuum chamber at a distance from the leading edge of a substrate support electrode disposed horizontal inside the chamber such that the strength of the diverter magnetic field in the vicinity of the leading edge was on the order of 100 Maxwell/cm$^2$ (100 Gauss). The strength of the resultant of the primary auxiliary magnetic fields in this region was an equivalent value.

A conventional 4-inch silicon wafer that had been pretreated in a heated oxidizing atmosphere to develop a uniform surface coating of silicon dioxide was placed on the support surface of the electrode. After evacuation of the chamber, a combination of $C_2F_6$ and $O_2$, in an approximately 10 to 1 ratio, was bled into the chamber to a pressure of approximately 0.5 N/m$^2$ (3.8 millitorr). Rf power of 2.5 kw was applied to the support electrode for approximately one minute to generate a Plasma for etching the substrate surface.

The thickness of the oxide coating of two wafers subjected to the above treatment, one with and one without installation of the diverter magnet assembly, was measured in thirteen preselected locations evenly distributed over the face of each wafer. Without the diverter magnet assembly, the nonuniformity of the oxide thickness measurements was 14.3%, and the greatest deviation was in the "hot spot" region. With the diverter magnet assembly installed, the nonuniformity of the measurements was only 6.6%.

Thus, the diverter magnet arrangement of the present invention provides a simple and inexpensive solution to the "hot spot" problem that results from electron drift in a magnetically enhanced plasma processing system.

It will be appreciated that other magnetic structures can be devised to achieve a comparable diverter magnetic field geometry, but the above-described assembly is exceptionally inexpensive and easy to manufacture.

I claim:

1. A magnetically enhanced plasma processing apparatus, the apparatus including a vacuum chamber, a workpiece support electrode disposed within the chamber, the electrode having a length dimension between first and second ends thereof, a width dimension between first and second side edges of said electrode, a thickness dimension smaller than the length and width dimensions, and a processing surface for supporting a flat workpiece between the first and second ends and first and second side edges;

primary magnet means, including first and second magnetic members disposed at the first and second ends of the electrode, respectively, the first magnetic member constituting a first magnetic pole of one polarity and the second magnetic member constituting a second magnetic pole of opposite polarity, the first and second magnetic poles generating a primary magnetic field that extends between the poles in the direction of the length dimension of the electrode in front of the processing surface and extends continuously around the electrode;

auxiliary magnet means spaced from the processing surface and having third and fourth magnetic poles disposed above, parallel to, and opposite the first and second magnetic poles, respectively, of the primary magnet means, said auxiliary magnet means being disposed for generating an auxiliary magnetic field that tends to flatten the primary magnetic field in front of the processing surface;

means for evacuating the vacuum chamber;

means for delivering at least one preselected gas to the chamber; and means for delivering electrical energy to the electrode sufficient to generate a plasma of ionized particles of said gas within the magnetic field in front of the processing surface, the polarity of the magnetic members being predetermined such that electron drift within said plasma occurs generally in the direction from the first edge of the electrode toward the second edge thereof, wherein the improvement comprises:

diverter magnet means for generating a third magnetic field having curved lines of force centered on an axis spaced from the first edge of the electrode such that the third magnetic field interacts with the result of the primary field and the auxiliary field at the first edge of the electrode and acts to stabilize the plasma in this region.

2. A plasma processing apparatus according to claim 1 wherein the axis of the third magnetic field lies in a plane containing the processing surface.

3. A plasma processing apparatus according to claim 1 wherein the second magnet means comprises an elongated first magnetic pole means of a first magnetic polarity disposed on one side of a plane containing the processing surface and an elongated second magnetic pole means of a second magnetic polarity opposite to the first magnetic polarity disposed on a second side of said plane containing the processing surface.

4. A plasma processing apparatus according to claim 1 wherein the second magnetic means comprises an elongated flat plate of magnetic material, the first magnetic pole means comprises a first plurality of disc magnets arranged on the plate in a first row parallel to the longitudinal dimension of the plate, and the second magnetic pole means comprises a second plurality of disc magnets arranged on the plate in a second row parallel to the first row.

5. A plasma processing apparatus according to claim 1 wherein the second magnet means is located outside the vacuum chamber.

* * * * *